(12) United States Patent
Jansen et al.

(10) Patent No.: US 7,423,722 B2
(45) Date of Patent: Sep. 9, 2008

(54) LITHOGRAPHIC APPARATUS AND DEVICE MANUFACTURING METHOD

(75) Inventors: Albert Johannes Maria Jansen, Bladel (NL); Jan Jaap Kuit, Veldhoven (NL); Erik Roelof Loopstra, Heeze (NL); Raymond Laurentius Johannes Schrijver, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 683 days.

(21) Appl. No.: 10/766,526

(22) Filed: Jan. 29, 2004

(65) Prior Publication Data

US 2005/0170296 A1    Aug. 4, 2005

(51) Int. Cl.
*G03B 27/32* (2006.01)
*G03B 27/42* (2006.01)

(52) U.S. Cl. .......................... 355/53; 355/77
(58) Field of Classification Search ............ 365/53, 365/72, 75, 77
See application file for complete search history.

(56) References Cited

U.S. PATENT DOCUMENTS

| | | | | |
|---|---|---|---|---|
| 4,758,863 A | * | 7/1988 | Nikkel | 355/40 |
| 4,878,086 A | * | 10/1989 | Isohata et al. | 355/77 |
| 5,281,996 A | * | 1/1994 | Bruning et al. | 355/77 |
| 5,721,606 A | * | 2/1998 | Jain | 355/53 |
| 5,897,986 A | * | 4/1999 | Dunn et al. | 430/394 |
| 6,191,429 B1 | * | 2/2001 | Suwa | 250/548 |
| 6,590,636 B2 | * | 7/2003 | Nishi | 355/53 |
| 6,967,713 B2 | * | 11/2005 | McCullough et al. | 355/75 |
| 2004/0046947 A1 | * | 3/2004 | Yuan et al. | 355/53 |
| 2005/0012914 A1 | * | 1/2005 | Lin | 355/53 |
| 2005/0151947 A1 | * | 7/2005 | Fujimaki | 355/55 |

FOREIGN PATENT DOCUMENTS

| | | | |
|---|---|---|---|
| JP | 63-107023 A | 5/1988 |
| JP | 4-162670 A | 6/1992 |
| JP | 2000-306817 A | 11/2000 |

OTHER PUBLICATIONS

Translation of Notice of Reasons for Rejection dated Jan. 29, 2008 for Japanese Patent Application No. 2005-020587.

* cited by examiner

*Primary Examiner*—Rodney E Fuller
(74) *Attorney, Agent, or Firm*—Pillsbury Winthrop Shaw Pittman, LLP

(57) ABSTRACT

A lithographic apparatus has a mask table adapted to accommodate a mask in at least two positions so that a mask with a pattern area larger than the exposure field can be imaged by first performing an exposure with the mask in the first position and then performing a second exposure with the mask in the second position.

32 Claims, 2 Drawing Sheets though a scanner can image a pattern much longer in the scanning direction than the exposure field, the width of the pattern that can be imaged in a single exposure is still limited by the size of the projection system. To image a pattern wider than the exposure field, the pattern is typically split across multiple masks which are separately imaged onto the substrate side-by-side. Such a process however has a low throughput due to the necessary mask exchanges.

It would be possible to image a pattern larger than the exposure field in two directions by providing a mask table that can be positioned over the necessary range in two directions. A conventional scanning mask stage has a large range of motion in the scanning direction (here referred to as the Y direction) and has a much smaller range of motion in other directions to make position corrections only. However, such a mask table and its drive systems would necessarily be considerably larger and more complicated than in the case where only scanning in one direction is performed. An increase in mass of the mask stage is especially undesirable because it usually performs accelerations 4 or 5 times higher than the substrate stage due to the demagnification of the projection system, which is conventionally ¼ or ⅕.

Accordingly, it would be advantageous, for example, to provide a simpler lithographic apparatus capable of imaging a pattern larger than the exposure field.

According to an aspect, there is provided a lithographic apparatus comprising:

an illumination system configured to provide a beam of radiation;

a mask table configured to hold a mask, the mask configured to impart the beam with a pattern, said mask table being adapted to receive said mask at at least two positions displaced in a first direction so that different parts of the pattern on the mask can be brought within an exposure field when the mask is in different ones of said positions;

a substrate table configured to hold a substrate; and a projection system configured to project the patterned beam onto a target portion of the substrate, wherein said exposure field of said projection system is smaller than said mask in at least the first direction.

To image different parts of the mask, the mask is displaced relative to the projection system. Rather than effect this displacement by providing a moving mask table, it is proposed to move the mask on the mask table. In an embodiment, the mask table is increased in size to accommodate the different positions of the mask but this is considerably simpler than providing a mask table that moves in long distances in two directions. It should be noted however that the mask table may still be provided with a small range of movement for fine positioning. This also avoids the need for extreme accuracy in the placement of the mask on the mask table.

Accordingly, a possible advantage of an apparatus according to an embodiment of the invention is a simpler and cheaper lithographic apparatus; either allowing larger masks to be imaged without an increase in the size and cost of the projection system, or allowing standard size masks to be imaged using a substantially smaller and cheaper projection system. The throughput of such an apparatus may be lower than a comparable apparatus with an exposure field of the same size as the pattern to be projected but the reduced capital cost (cost of goods) of an apparatus according to an embodiment of the invention may provide a lower overall cost of ownership.

In an embodiment, the lithographic apparatus comprises a mask handling device configured to place said mask on said mask table selectively in different ones of said positions. Movement of the mask to different positions on the mask table can be achieved, for example, by using a conventional mask handling device or robot, with only a small extension to its range of motion.

In an embodiment, the distance between the center of the mask when in the first position and the center of the mask when in the second position is substantially equal to the length of the exposure field in the first direction. (Note that in many apparatus the actual exposure field used for a given exposure may be shuttered down from the maximum exposure field the apparatus is capable for. Unless the context otherwise requires, the term "exposure field" is used herein to refer to the largest exposure field the apparatus is capable of.) The distance may be slightly less than the length to accommodate an overlap of the exposures necessary to image the whole pattern. An overlap combined with a trapezoidal illumination profile can reduce stitching errors as compared to simply butted stitching.

Two suitable displaced positions of the mask can enable a mask pattern up to twice the size of the exposure field to be imaged onto the substrate. However, in general the mask table may be able to accommodate the mask in N positions to allow imaging of a pattern up to N times the length of the exposure field in the first direction. The value of N may be in the range of from 2 to 5.

Flexibility may be achieved with a mask table able to accommodate the mask at a large number or continuum of positions in the first direction. This can be achieved, for example, by providing one or more clamps to clamp the mask along its edges parallel to the first direction.

While an embodiment of the present invention may be embodied as a stepper (i.e. the mask table is essentially static except for positioning corrections), in an embodiment, the lithographic apparatus may be of a scanning type in which the mask table scans during an exposure in a second direction that is perpendicular to the first direction. Such an arrangement requires relatively minor adaptations to existing scanning mask table designs to enable the mask to be received at different positions.

In an embodiment, the mask table comprises one or more mask clamps to clamp the mask along its edges parallel to a scanning direction.

According to a further aspect, there is provided a device manufacturing method comprising:

using a mask to impart a beam of radiation with a pattern, wherein said mask is positioned on a mask table at a first position to image a first portion of the pattern of said mask and is subsequently positioned on said mask table at a second position to image a second portion of said pattern; and projecting the patterned beam of radiation onto a target portion of a substrate.

Where, as is frequently the case, a plurality of copies of the same pattern are to be imaged onto a substrate, the first portions of each copy can be imaged first, followed by the second portions. This approach can maximize throughput. Alternatively, the second portion of each copy may be imaged directly after the first portion of that copy. This approach can maximize accuracy, and hence yield, by minimizing errors, for example placement or overlay errors due to thermal expansion or creep during a series of exposures.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
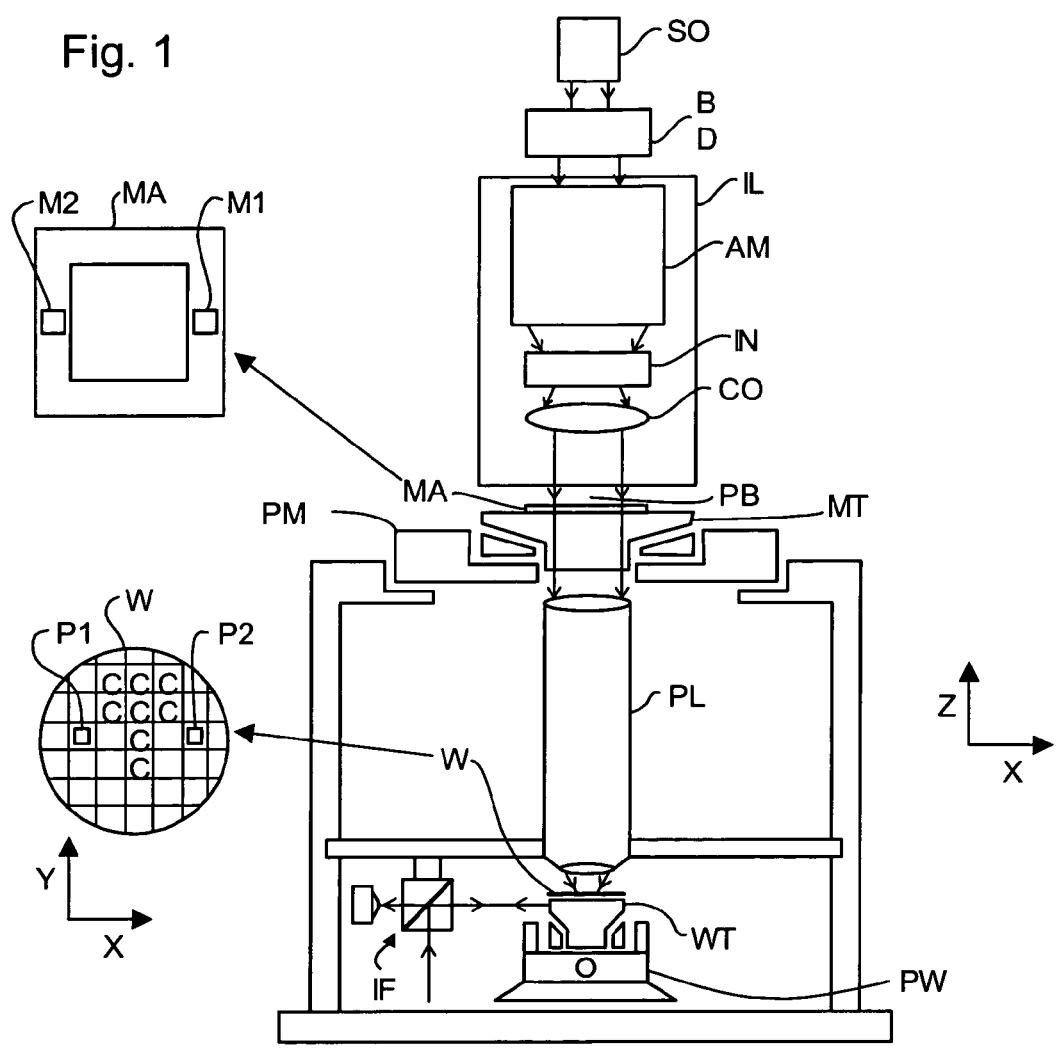
FIG. 1 depicts a lithographic apparatus according to a first embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV radiation or DUV radiation).

a first support structure (e.g. a mask table) MT for supporting a patterning device (e.g. a mask) MA and connected to first positioning means PM for accurately positioning the patterning device with respect to item PL;

a substrate table (e.g. a wafer table) WT for holding a substrate (e.g. a resist-coated wafer) W and connected to second positioning means PW for accurately positioning the substrate with respect to item PL; and a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as π-outer and π-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the projection system PL, which focuses the beam onto a target portion C of the substrate W. With the aid of the second positioning means PW and position sensor IF (e.g. an interferometric device), the substrate table WT can be moved accurately, e.g. so as to position different target portions C in the path of the beam PB. Similarly, the first positioning means PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum length of the exposure field limits the width (in the non-scanning direction) of the target portion in a single dynamic exposure, whereas the length of the scanning motion determines the height (in the scanning direction) of the target portion.

Combinations and/or variations on the above described modes of use or entirely different modes of use may also be employed.

Figure 2:
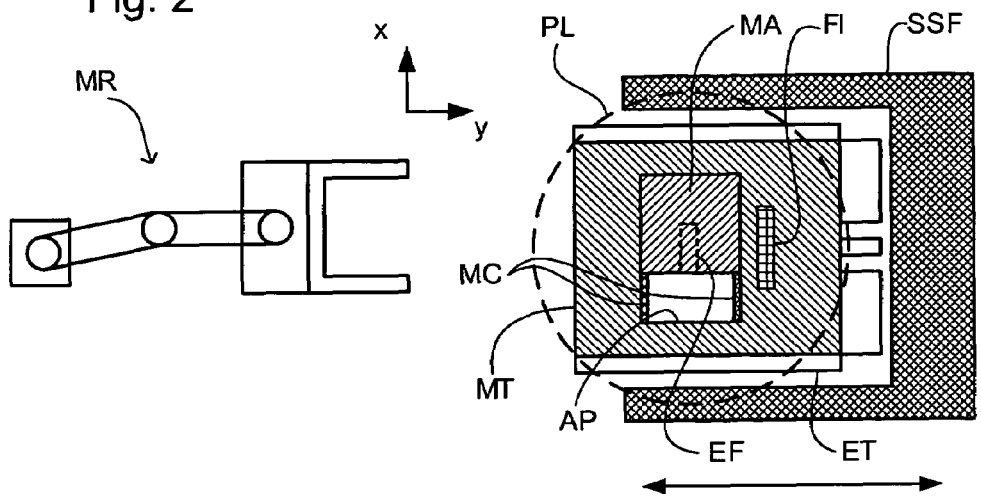
FIG. 2 depicts a mask table of the first embodiment of the invention with the mask in a first position.
Figure 3:
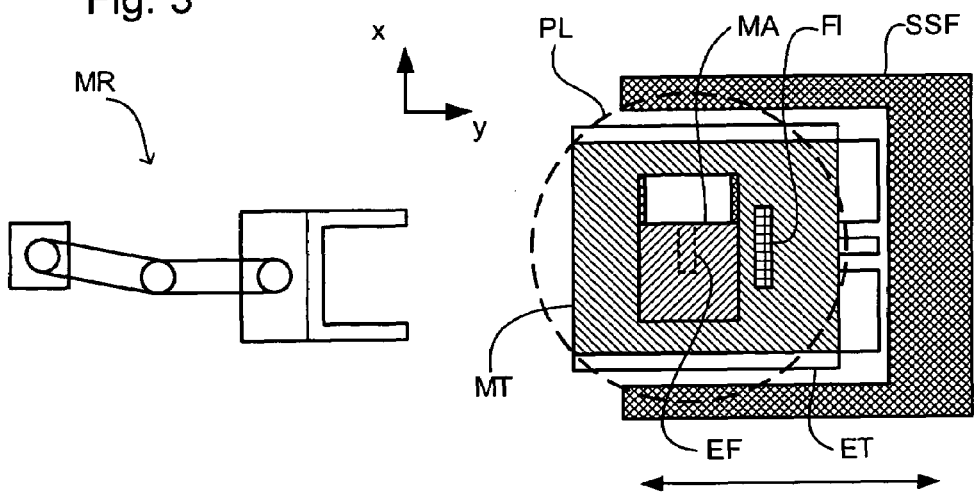
FIG. 3 depicts the mask table of the first embodiment of the invention with the mask in a second position.

An embodiment of the mask table of the lithographic apparatus is shown in greater detail in FIGS. 2 and 3. The mask table MT is held by a short stroke frame SSF. The mask table MT and/or the short stroke frame is (are) provided with all or portions of a fine positioning means (not shown) to make fine adjustments of the position of the mask table MT relative to the short stroke frame SSF in (up to) six degrees of freedom. Coarse positioning means (also not shown) are provided to scan the short stroke frame SSF in the Y direction (as indicated by the double-headed arrow) to perform a scanned exposure. The mask table is also provided with encoder tracks ET to enable the position of the mask in at least the scan direction to be determined by an encoder head. Other forms of position and/or displacement measuring systems such as an interferometer may be used in addition or instead. A fiducial block FI contains reference marks and/or sensors of various types.

In this case because the mask is transmissive, the mask table defines an aperture AP over which the mask MA is held by mask clamps MC. The aperture AP is larger in the X direction (perpendicular to the Y or scan direction) than the mask MA so that the mask MA can be positioned on the mask table at different positions relative to the exposure field EF, the size and position of which is determined by the projection system. In this embodiment, the exposure field is about half the length (in the X direction) of the mask (more precisely the relevant pattern area of the mask) and the length of the aperture in the X direction is three times that of the exposure field. Thus the mask MA can be clamped in a first position, shown in FIG. 2, in which its lower half (as shown) can be scanned through the exposure (object) field and also in a second position, shown in FIG. 3, in which its upper half can be scanned through the exposure field. Thus, the complete mask image can be transferred to the substrate by two scanned exposures. Conventional stitching techniques, e.g. employing a trapezoidal intensity profile and an overlap, can be used to ensure the joined images form a correct device layer.

It will be appreciated that a smaller exposure field may be used if the range of positions at which the mask may be clamped is correspondingly increased. In general, the range of positions of the mask should be equal to twice the relevant mask dimension less the length of the exposure field. It is convenient that the mask pattern width is an integer multiple of the length of the exposure field for efficiency but this is not essential. It should also be noted that the aperture in the mask table need not extend the full range of positions of the mask but need only correspond to the exposure field.

To move the mask between positions on the mask table, a mask handling robot MR of a conventional type may be used, provided that its range of movement is expanded to encompass the desired mask positions. To move the mask, the mask table is moved to a mask load/unload position, the mask is picked up by the mask handling robot and put down in the new position. A dedicated device to move the mask may instead be provided. The accuracy of placement of the mask need only be within the range of movement of the fine positioning system of the mask table, which is readily achievable with known robots. Any pellicle and frame attached to the mask is moved with it.

When exposing the same pattern multiple times on a single substrate, throughput can be maximized by exposing the first halves of all of the copies of the pattern and then the second halves of all of the copies. In this way only one mask move is needed. Alternatively, it is possible to image the first half of one copy, then the second half of that copy before moving on to the next copy. This order minimizes the possibility of stitching errors due to thermal expansion or creep of the substrate during a series of exposures but the number of mask moves is increased reducing throughput. Which order is preferred will depend on whether throughput or yield is prioritized.

Figure 4:
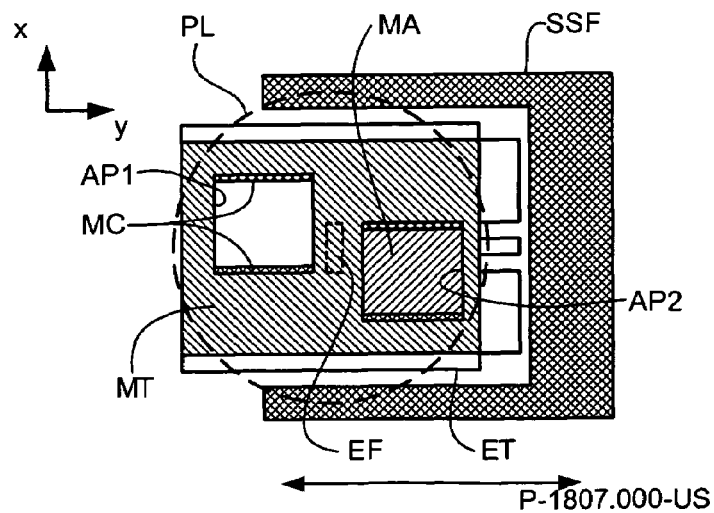
FIG. 4 depicts the mask table of a second embodiment of the invention.

A second embodiment of the invention is shown in FIG. 4. This embodiment is essentially the same as the first embodiment save as described below.

In the first embodiment, the mask is clamped along its edges parallel to the X direction however masks are conventionally arranged to be clamped along the edges parallel to the scan direction and it may not be desirable to rotate the mask. Thus in the second embodiment, again because in this case the mask is transmissive, two separate apertures AP1, AP2 with respective clamps MC are provided in the mask table MT. The apertures are displaced from the center line of the mask table in opposite directions so that when the mask is in place over aperture AP1 its lower half is scanned by the exposure field and in aperture AP2 its upper half is scanned by the exposure field. In this embodiment the length of the mask table in the Y, or scan, direction and the scanning range of the mask table are increased. The range of the mask handling robot MR may also need to be increased.

While specific embodiments of the invention have been described above, it will be appreciated that the invention may be practiced otherwise than as described. The description is not intended to limit the invention.

The invention claimed is:

1. A lithographic apparatus comprising:
   an illumination system configured to provide a beam of radiation;
   a mask table configured to hold a mask, the mask configured to impart the beam with a pattern, said mask table being configured to receive said mask at at least two positions displaced in a first direction so that at least a different part of the mask table comes into contact with the mask at each of the at least two positions and so that different parts of the pattern on the mask can be brought within an exposure field when the mask is in different ones of said positions;
   a substrate table configured to hold a substrate; and
   a projection system configured to project the patterned beam onto a target portion of the substrate, wherein said exposure field of said projection system is smaller than said mask in at least the first direction.

2. Apparatus according to claim 1, further comprises a mask handling device configured to place said mask on said mask table selectively in different ones of said positions.

3. Apparatus according to claim 1, wherein the distance between the center of said mask when in the first position and the center of said mask when in the second position is substantially equal to the length of said exposure field in said first direction.

4. Apparatus according to claim 3, wherein said distance is slightly less than said length to provide an overlap of the exposures necessary to image the whole pattern.

5. Apparatus according to claim 1, wherein said mask table is configured to accommodate the mask in N positions to allow imaging of a pattern up to N times the length of the exposure field in the first direction, where N is in the range of from 2 to 5.

6. Apparatus according to claim 1, wherein said mask table is configured to accommodate the mask at a large number or continuum of positions in the first direction.

7. Apparatus according to claim 6, wherein said mask table comprises a mask clamp to clamp the mask along its edges parallel to the first direction.

8. Apparatus according to claim 1, further comprising a fine positioning actuator configured to make fine adjustments of the position of the mask table in at least said first direction.

9. Apparatus according to claim 1, further comprising a long stroke drive unit configured to scan said mask table during an exposure in a second direction that is substantially perpendicular to said first direction.

10. Apparatus according to claim 1, wherein said mask table comprises a mask clamp to clamp the mask along its edges parallel to a scanning direction.

11. Apparatus according to claim 1, wherein the apparatus is configured to at least partly fill a space between said projection system and the substrate with a liquid.

12. A device manufacturing method comprising:
    using a mask to impart a beam of radiation with a pattern, wherein said mask is positioned on a mask table at a first position to image a first portion of the pattern of said mask and is subsequently positioned on said mask table at a second position to image a second portion of said pattern, wherein the mask at the second position is in contact with at least a different part of the mask table than at the first position; and
    projecting the patterned beam of radiation onto a target portion of a substrate.

13. A method according to claim 12 for imaging a plurality of copies of the same pattern onto a substrate, wherein the first portions of each copy are imaged first, then the mask is positioned at said second position and then said second portions of each copy are imaged.

14. A method according to claim 12 for imaging a plurality of copies of the same pattern onto a substrate, wherein the first portion of a first copy is imaged onto said substrate, said mask is positioned at said second position and then the second portion of said first copy is imaged before the first portion of a second copy is imaged.

15. A method according to claim 12, comprising placing said mask on said mask table selectively in different ones of said positions using a mask handling device.

16. A method according to claim 12, wherein the distance between the center of said mask when in the first position and the center of said mask when in the second position is substantially equal to the length of an exposure field when projecting said patterned beam.

17. A method according to claim 16, wherein said distance is slightly less than said length to provide an overlap of the exposures necessary to image the whole pattern.

18. A method according to claim 12, wherein said mask table is configured to accommodate the mask in N positions to allow imaging of a pattern up to N times the length of the exposure field, where N is in the range of from 2 to 5.

19. A method according to claim 12, wherein said mask table is configured to accommodate the mask at a large number or continuum of positions.

20. A method according to claim 19, wherein said mask table comprises mask clamps to clamp the mask along its edges parallel to a direction substantially perpendicular to a scanning direction.

21. A method according to claim 12, further comprising finely positioning said mask table in a direction substantially perpendicular to a scanning direction.

22. A method according to claim 12, further comprising positioning said mask table in a scanning direction during an exposure.

23. A method according to claim 12, wherein said mask table comprises a mask clamp to clamp the mask along its edges parallel to a scanning direction.

24. A method according to claim 12, comprising projecting the patterned beam of radiation through a liquid onto the target portion of the substrate.

25. A method according to claim 12, further comprising at least partly filling a space between the substrate and a projection system used to project the patterned beam of radiation with a liquid.

26. An immersion lithographic apparatus, comprising:
- a mask table configured to hold a mask, the mask configured to impart a beam of radiation with a pattern;
- a substrate table configured to hold a substrate; and
- a projection system configured to project the patterned beam of radiation through a liquid onto a substrate,
- wherein the apparatus is configured to at least partly fill a space between said projection system and the substrate with a liquid and is configured to position the mask such that a first portion of said mask is projected during a first scanning motion onto a first portion of the substrate and a second different portion of said mask is projected during a second subsequent scanning motion onto a second portion of the substrate butting or overlapping the first portion of the substrate.

27. Apparatus according to claim 26, wherein said mask table is configured to receive said mask at at least two positions displaced in a first direction so that the first and second portions of the mask can be brought within an exposure field when the mask is in different ones of said positions and said exposure field is smaller than said mask in at least the first direction.

28. Apparatus according to claim 27, further comprising a mask handling device configured to place said mask on said mask table selectively in different ones of said positions.

29. Apparatus according to claim 27, wherein the distance between the center of said mask when in the first position and the center of said mask when in the second position is substantially equal to the length of said exposure field in said first direction.

30. Apparatus according to claim 29, wherein said distance is slightly less than said length to provide overlap of the first and second portions of the substrate to image the whole pattern.

31. Apparatus according to claim 26, wherein said mask table is configured to accommodate the mask in N positions to allow imaging of a pattern up to N times the length of the exposure field in the first direction, where N is in the range of from 2 to 5.

32. Apparatus according to claim 27, wherein said mask table is configured so that at least a different part of the mask table comes into contact with the mask at each of the at least two positions.

* * * * *